United States Patent
Shapiro

(10) Patent No.: US 6,628,814 B1
(45) Date of Patent: Sep. 30, 2003

(54) EXPANSION CARD AND INTEGRATED FINGERPRINT ACQUISITION SYSTEM

(75) Inventor: Yury Shapiro, San Ramon, CA (US)

(73) Assignee: Identix Incorporated, Sunnyvale, CA (US)

( * ) Notice: Subject to any disclaimer, the term of this patent is extended or adjusted under 35 U.S.C. 154(b) by 0 days.

(21) Appl. No.: 09/497,720

(22) Filed: Feb. 4, 2000

(51) Int. Cl.⁷ .................................................. G06K 9/00
(52) U.S. Cl. ....................................... 382/127; 235/380
(58) Field of Search ................................ 382/115, 124, 382/127; 356/71; 340/5.53; 439/55, 131, 329, 640; 283/99; 361/600; 455/90; 235/380

(56) References Cited

U.S. PATENT DOCUMENTS

| | | | |
|---|---|---|---|
| 4,202,120 A | 5/1980 | Engel | 283/99 |
| 5,180,901 A | 1/1993 | Hiramatsu | 235/380 |
| 5,183,404 A | 2/1993 | Aldous et al. | 439/55 |
| 5,336,099 A | 8/1994 | Aldous et al. | 439/131 |
| 5,338,210 A | 8/1994 | Beckham et al. | 439/131 |
| 5,393,241 A | 2/1995 | Honda et al. | 439/248 |
| 5,448,659 A | 9/1995 | Tsutsui et al. | 385/14 |
| 5,505,633 A | 4/1996 | Broadbent | 439/329 |
| 5,559,504 A | 9/1996 | Itsumi et al. | 340/5.53 |
| 5,637,018 A | 6/1997 | Gargiulo | 439/640 |
| 5,655,143 A | 8/1997 | Alpert et al. | 361/600 |
| 5,732,148 A | 3/1998 | Keagy et al. | 382/124 |
| 5,779,496 A | 7/1998 | Bolinger et al. | 439/377 |
| 5,918,163 A | 6/1999 | Rossi | 455/90 |
| 5,982,913 A | 11/1999 | Brumbley et al. | 382/124 |
| 5,995,630 A | 11/1999 | Borza | 380/54 |
| 6,115,484 A | 9/2000 | Bowker et al. | 382/127 |
| 6,116,927 A | 9/2000 | Johnson et al. | 439/131 |
| 6,183,308 B1 | 2/2001 | Laity | 439/676 |
| 6,213,403 B1 | 4/2001 | Bates, III | |

FOREIGN PATENT DOCUMENTS

JP 64-68844 3/1989

OTHER PUBLICATIONS

"PC Card Technology Primer", PCMCIA, 1999, The Worldwide Organization for Modular Peripherals, 5 pgs.
Chappell Brown, "Processor enables print ID on a card", Electronic Engineering Times, Oct. 13, 1997.

Primary Examiner—Samir Ahmed
(74) Attorney, Agent, or Firm—William J. Egan, III; Beyer Weaver & Thomas, LLP.

(57) ABSTRACT

An expansion card with an integrated fingerprint acquisition system is provided hat is able to be connected to a portable computer. In one aspect of the invention, CMCIA standards are used for the expansion card. The expansion card is built such the fingerprint acquisition system is on a slidable carriage which may extend out from the expansion card housing, or may be retracted into the housing when the fingerprint acquisition system is not in use. A locking mechanism keeps the carriage in the retracted position, and a spring provides the force necessary to slide the carriage into the extended position when pressure is placed on the slidable carriage. An advantage of the invention is that the fingerprint recognition device is small enough to fit within a PCMCIA standard expansion card. Another advantage of the invention is that the fingerprint recognition system, when not in use, is enclosed within a portable computer's housing such that the invention does not use additional desk space in addition to the portable computer itself, other than that necessary for the retractable access portion to extend into an extended position.

8 Claims, 5 Drawing Sheets

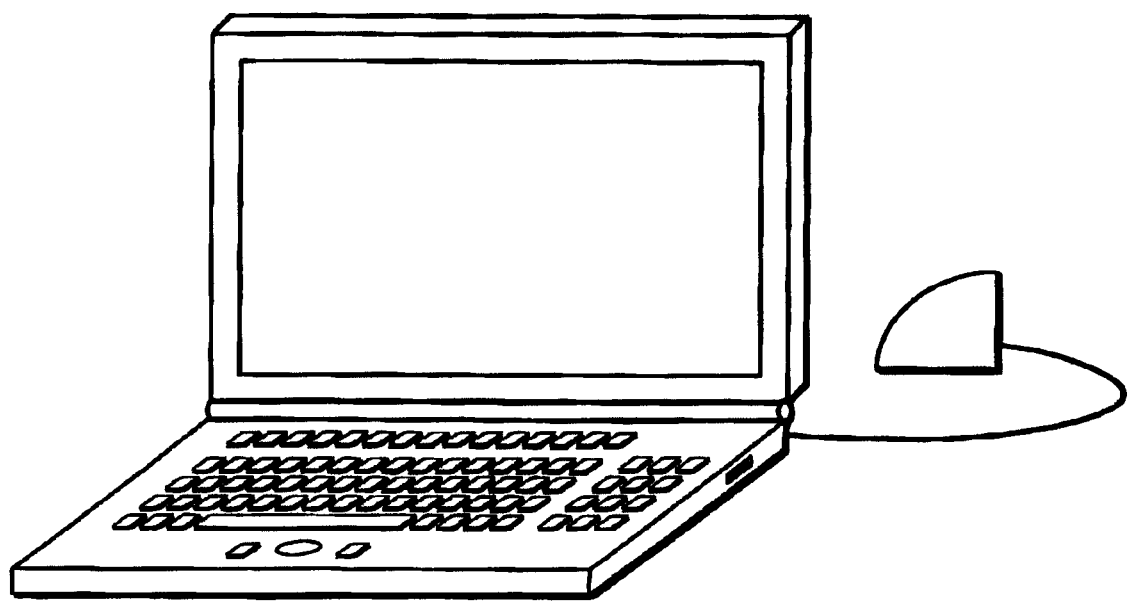
FIG._1
*(PRIOR ART)*

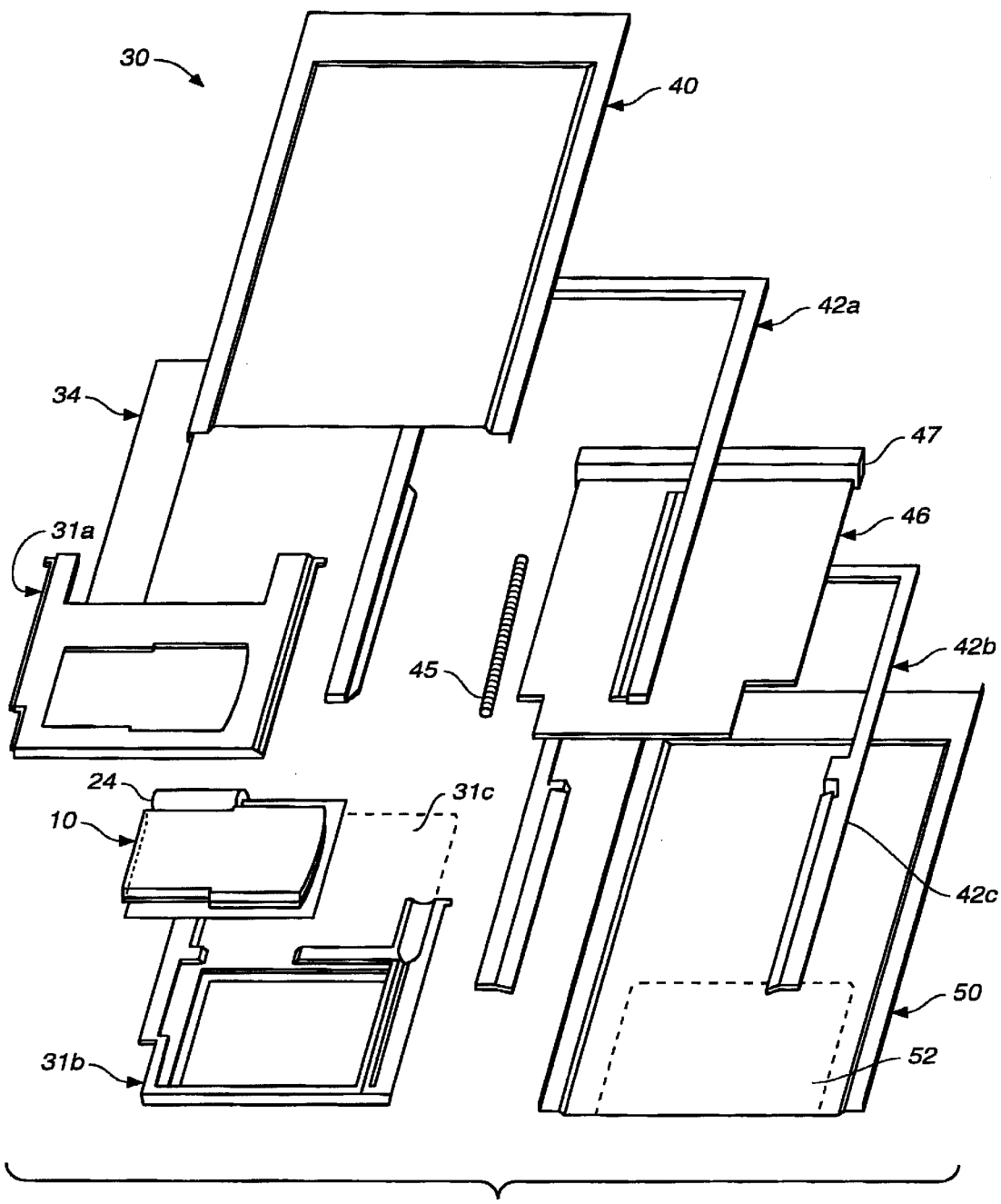
FIG._2

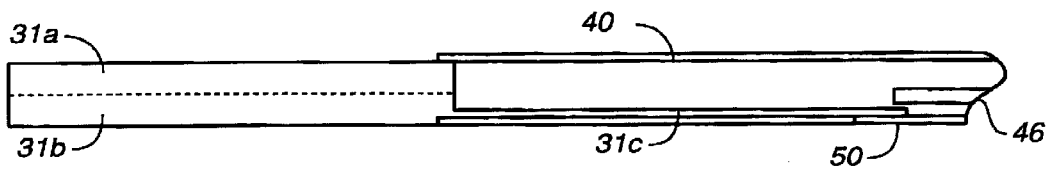
FIG._3
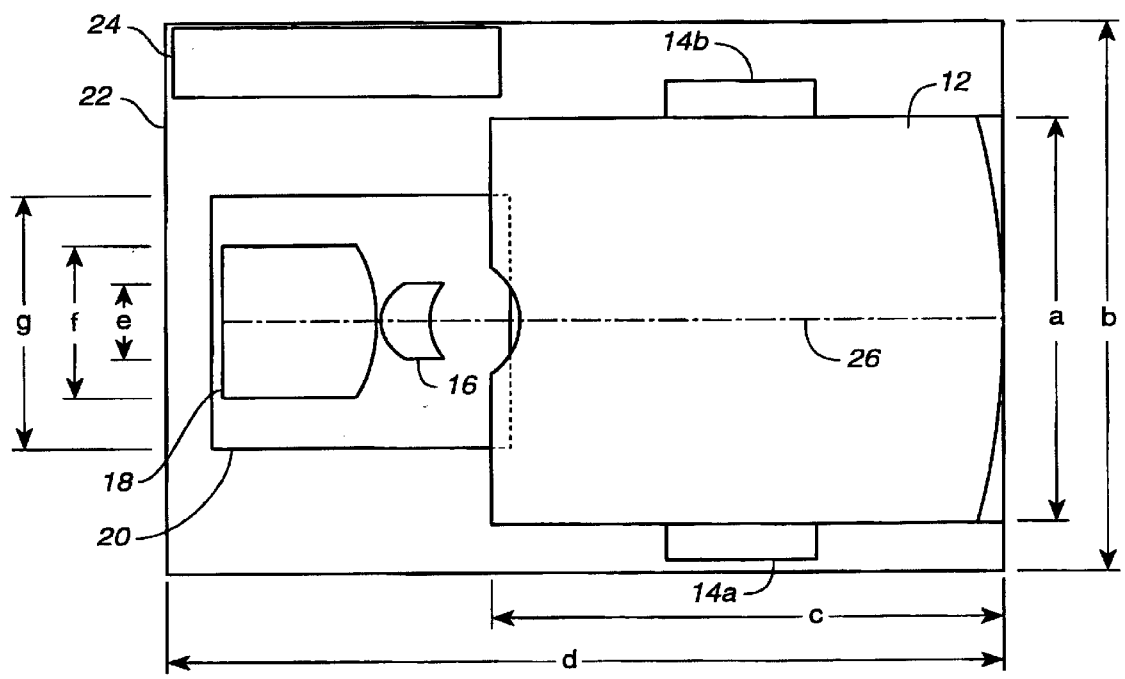
FIG._4
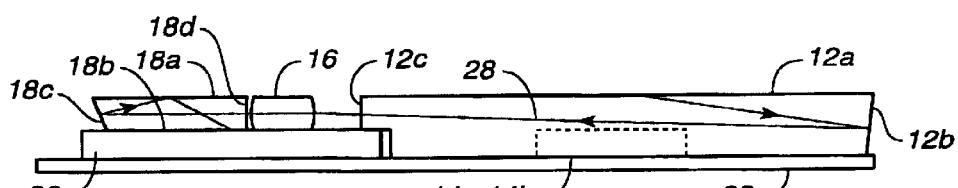
FIG._5

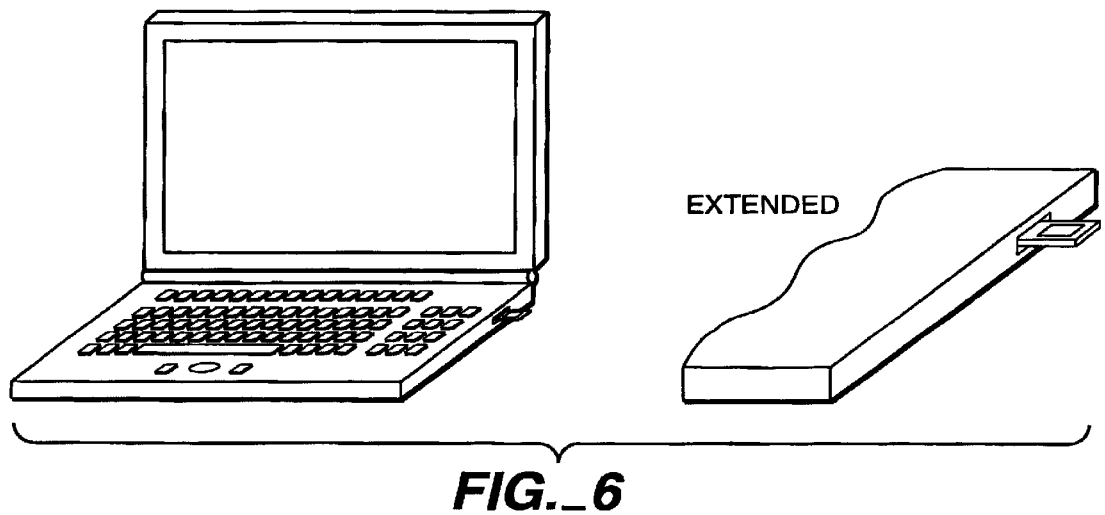
FIG._6
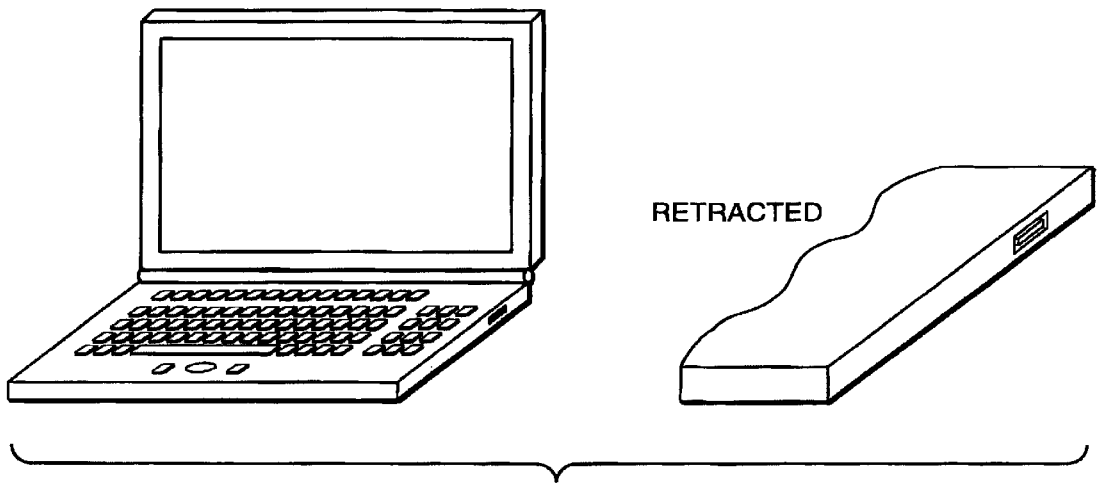
FIG._7

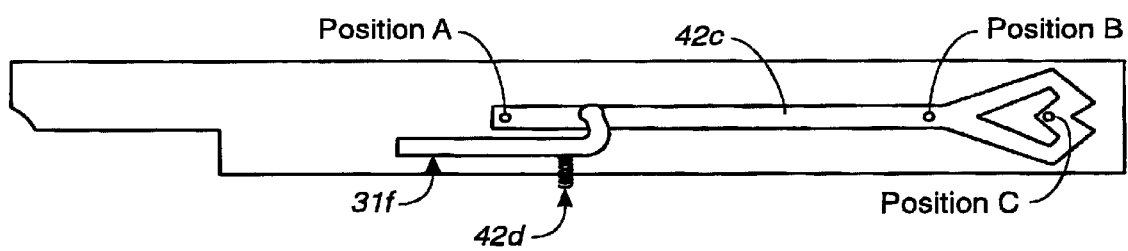
FIG._8
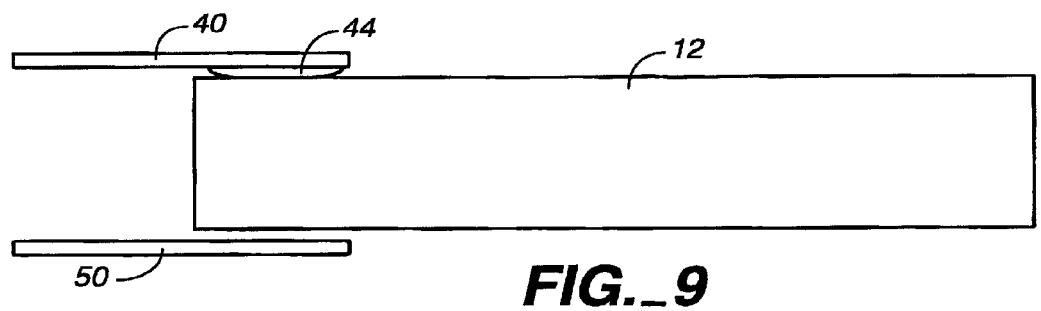
FIG._9

EXPANSION CARD AND INTEGRATED FINGERPRINT ACQUISITION SYSTEM

FIELD

The present invention relates to the field of fingerprint recognition. More particularly, the invention relates to an expansion card with an integrated fingerprint acquisition device on a retractable access portion of the card.

BACKGROUND

Computer security and access is an important issue. Methods of identifying individuals are important to providing computer access only to predetermined users. Fingerprints provide a unique and absolute means of identification that does not require remembering passwords and is also difficult to falsify.

Electronic fingerprint acquisition systems have been introduced to eliminate the need for ink or a chemical reagent. In such systems, the subject's fingertip is pressed against or rolled over a flat transparent (e.g. glass) platen in an optical system. Light is directed through the platen and is reflected from the fingertip into an optical path including mirrors, lens and an electronic image sensor such as a CCD imager of the type employed in video cameras. The image of the fingerprint may be digitized, analyzed, printed out, stored, transmitted or compared with an existing fingerprint or fingerprints. See, for example, U.S. Pat. No. 5,732,148, incorporated herein by reference.

A problem with existing electronic fingerprint acquisition systems is that they tend to be bulky and large in size. While the general size of fingerprint acquisition systems has been reduced in recent years, the size is generally prohibitive for efficient use with laptop computers, notebook computers, or other devices with expansion slots, hereinafter referred to collectively as portable computers.

Portable computers are more limited in space than are desktop computers. The internal spatial restrictions of portable computers have required the establishment of standards for the internal accessories of these computers. One set of standards applicable to PC Cards, also referred to as PCMCIA cards, was developed by the Personal Computer Memory Card International Association (PCMCIA). The PCMCIA promulgated standards for PC Cards that are now virtually universal in the portable computer industry. The PCMCIA promulgated standards stating that the spatial standards for all PC Cards used in portable computers should be restricted to a rectangular space approximately 54 mm in width and 85.6 mm in length. Additionally, Type I, Type II, and Type III cards would have a thickness of 3.3 mm, 5 mm, and 10.5 mm, respectively.

In keeping with the PCMCIA standards for memory cards, internal modem manufacturers have adopted the same spatial standards for use with their portable computer communications cards. By complying with the standards established by the PCMCIA for memory cards, communications card manufacturers assured themselves compatibility and spatial conformity with computers utilizing the PCMCIA standards.

With most, if not all, new portable computers being manufactured with at least one PCMCIA peripheral slot, the PCMCIA specifications are now regarded as a standard in the portable computer industry for internal accessories.

There exists a need for a fingerprint acquisition device which is capable of being used in conjunction with a portable computer without additional space requirements. The prior art, as shown in FIG. 1, shows electronic fingerprint acquisition systems that attach to a desktop or portable computer via the serial port, the parallel port, or a Universal Serial Bus (USB) port. These devices tend to be bulky, reside outside of the computer's housing, and require a lengthy cord. Further, when these devices are not in use, the device is still taking up often limited space surrounding the portable computer. An example of such a device is the U.are.U Fingerprint Recognition System available from Digital Persona, Inc. in Redwood City, Calif.

Users of portable computers often desire as few external peripheral attachments as possible. External peripheral attachments take up extra baggage space, are more easily broken and lost, and require additional functional space when in use. People often use portable computers in confined spaces, such as while seated in an airplane, that are not conducive to the extra space required by external peripheral devices attached to a portable computer. This is one reason for the development of standards, such as PCMCIA, for internal accessories of portable computers.

The first PCMCIA cards developed for communication accessories generally required an intermediate cable extending from the PCMCIA card. An example is provided with respect to modems. The intermediate cable is adapted to connect between the PCMCIA card and a standard telephone RJ-11 cable. A problem with this configuration is that if the cable is damaged or lost, the accessory is unusable until the cable is repaired or replaced. One solution to this problem is to have a cable jack that is extendable from the PCMCLA card, as described in U.S. Pat. Nos. 5,336,099 and 5,338, 210.

SUMMARY

The present invention relates to a fingerprint acquisition system. More particularly, the invention relates to an expansion card with an integrated fingerprint acquisition device on a retractable access portion of the interface card. The invention provides an extension to the interface card that protrudes from the laptop computer providing a permanent interface. That is, the portion of the interface card protruding from the computer provides the scanning area on which a fingerprint is received. This structure eliminates the need for an intermediate cable. The extension is retractable into the interface card when not in use, thereby preventing the fingerprint reader from damage.

In an exemplary embodiment, the expansion card is constructed such that a retractable access portion, or carriage, is able to slidably extend out from the end of the expansion card. Constructed to fit on the carriage, the fingerprint acquisition device has the capability of extending from and retracting back into the expansion card housing. Thus, the fingerprint acquisition system is only exposed outside a portable computer when it is necessary to scan a fingerprint. While not in the use, the fingerprint acquisition device is retracted into the expansion card, providing added protection for the fingerprint acquisition device from damage, and leaving more usable space surrounding the portable computer. When the fingerprint reader is extended outside the protective casing and exposed to human finger touch, it may, over time, accumulate oil or foreign particles on its surface. Addressing this concern, the invention cleans the prism surface as the reader is extended out from and retracted into the expansion card.

In one embodiment, the expansion card is constructed in accordance with CMCIA standards, and the fingerprint acquisition device includes an imaging prism, a focal lens, a redirectional prism, an image sensing means, and a diffused light source. The fingerprint image prism is optically coupled to the focal lens, which is optically coupled to a redirectional prism. The redirectional prism is further optically coupled to the image sensor.

An advantage of the invention is that the fingerprint recognition device is small enough to fit within a PCMCIA standard expansion card.

Another advantage of the invention is that the fingerprint recognition system, when not in use, is enclosed within a portable computer's housing such that the invention does not use additional desk space in addition to the portable computer itself, other than that necessary for the retractable access portion to extend into an extended position.

Additional advantages of the invention will become apparent upon reading the following detailed description and upon reference to the drawings.

BRIEF DESCRIPTION OF THE DRAWINGS

FIG. 1 depicts a prior art fingerprint acquisition system connected to a portable computer;

FIG. 2 depicts an exploded view of the PCMCIA fingerprint system;

FIG. 3 depicts a side view of the PCMCIA fingerprint system;

FIG. 4 depicts a top view of the fingerprint acquisition system;

FIG. 5 depicts a side view of the fingerprint acquisition system;

FIG. 6 depicts the invention in the extended position;

FIG. 7 depicts the invention in the retracted position;

FIG. 8 depicts a slidable carriage of the invention; and

FIG. 9 depicts a cleaner of the invention.

DETAILED DESCRIPTION

In an exemplary embodiment, the invention is constructed to PCMCIA standards, and is disclosed herein. It should be appreciated that modifications can be made which are within the scope of the invention.

The fingerprint acquisition system 30 is now described with reference to FIGS. 2–7. As shown in FIG. 2, a fingerprint acquisition device 10 is housed in a slidable carriage 31. The slidable carriage is comprised of a carriage top 31a, a carriage bottom 31b and an optional cover 31c described below. The carriage top has a central portion cut out to allow access to a fingerprint receiving portion of the fingerprint acquisition device 10. The slidable carriage 31 is extended out from the expansion card by applying pressure on the slidable carriage which subsequently causes pressure to be exerted by a spring 45. Alternatively, the slidable carriage is retracted by applying pressure on the slidable carriage into the expansion card. As shown in FIG. 8, when the slidable carriage is positioned as extended out from the expansion card, a metal wire 31f is situated in position A of a groove 42c. When the slidable carriage is positioned as retracted into the expansion card, the metal wire is situated in position C of the groove. The metal wire passes by position B of the groove when the slidable carriage is retracted or extended out. The groove 42c extends along one side of the slidable carriage.

An expansion card housing comprises a sheet metal top 40, and a sheet metal bottom 50. Within the housing is a case 42 comprising a case top 42a, a case bottom 42b, and the groove 42c. Alse, within the housing is contained a PC board 46, the metal wire and a spring 45. The metal wire is attached to the case via groove 42c and a life spring 42d. When the carriage is in the retracted position, the spring 45 is held in a compressed state via the metal wire being situated in position C of the groove. When pressure is applied to the slidable carriage, the spring 45 expands, releasing the carriage from the housing. As shown in FIG. 9, when the carriage is retracted, a cleaner 44 wipes the surface of an imaging prism 12.

The case top 42a and the case bottom 42b are U-shaped structures, such that when placed together, a channel in which the carriage 31 slides is formed in each of the two substantially parallel lateral sides. The case top 42a and/or the case bottom 42b are constructed such that the carriage 31 cannot extend further than is necessary for the fingerprint receiving portion of the fingerprint acquisition device to receive a fingerprint, and such that the end of the carriage 31 is at least substantially flush with the end of the expansion card housing when the carriage is in the retracted position. The fingerprint acquisition system 30 is depicted with the carriage 31 in the extended position in FIG. 6, and with the carriage in the retracted position in FIG. 7.

Centrally located between the case top and case bottom is the PC board 46. On the end of the PC board is an expansion card connector 47 that allows the expansion card to interface with a portable computer. In one embodiment of the invention, the expansion card is a PCMCIA expansion card, and the connector 47 is a 68-pin PCMCIA connector. Also connected to the PC board is a flexible cable 34. The flexible cable is also connected to the fingerprint acquisition device 10 through a second connector 24. The flexible cable is connected such that when the carriage is extended from the housing, the flexible cable extends with the carriage, and when the carriage is retracted in the housing, the flexible cable is retracted with the carriage.

The sheet metal top 40 and sheet metal bottom 50 comprise the outer casing of the expansion card housing. The sheet metal top and the sheet metal bottom are standard pieces known in the art. The case top and case bottom are constructed such that the PCMCIA connector is accessible between the sheet metal top and the sheet metal bottom on the end opposite that which the carriage extends from.

In one aspect of the invention, the sheet metal bottom has an optional cut-out portion 52 to provide extra housing space for the carriage. This allows the fingerprint acquisition device to be constructed thicker than it could be without the cut-out portion 52. In such an aspect, connected to the carriage bottom 31b is a cover 31c, such that when the carriage is in the extended position, the cover extends over and covers the cutout portion 52, protecting the system from foreign objects entering through the cut-out portion. FIG. 3 depicts a side view of the expansion card, with the cover 31c extending from the carriage. The cover may be constructed of sheet metal, or any other material suitable to cover the cut-out portion 52.

A fingerprint acquisition device 10 that is suitable for use in the expansion card fingerprint acquisition system is now described with reference to FIGS. 4 and 5. An imaging prism 12 is provided. Adjacent to the imaging prism, are two diffused light sources 14a and 14b, such as LEDs, which are known in the art. In one aspect of the invention, one light source may be used. The imaging prism is optically coupled to a focal lens 16, and includes an upper planar surface 12a to receive a fingerprint, and an adjacent end surface 12b at a predetermined curvature and a predetermined angle to reflect the fingerprint image towards an exiting surface 12c. The exiting surface is adjacent to the upper planar surface, and has a curvature such that it directs the fingerprint image towards the focal lens 16. The focal lens is optically coupled to a redirectional prism 18, directing a focused fingerprint image into the redirectional prism. The redirectional prism 18 is optically coupled to an image sensor 20, and includes an upper planar surface 18a, a lower planar surface 18b, an end surface 18c, and an entry surface 18d. The upper and lower surfaces are substantially parallel to each other. The entry surface 18d receives the focused fingerprint image from the focal lens 16. The end surface 18c is adjacent to the upper and lower surfaces 18a, 18b opposite the entry surface 18d and is set at a predetermined angle to reflect the focused fingerprint image towards the upper planar surface. The upper planar surface 18a of the redirectional prism reflects the focused fingerprint image towards the lower planar surface 18b. The focused fingerprint image passes through the lower planar surface to the image sensor 20. The image sensor 20 may be a CCD, which is known in the art. The light path 28 of the fingerprint image is shown in FIG. 5.

The imaging prism 12, diffused light sources 14a and 14b, focal lens 16, redirectional prism 18, and image sensing means 20 are all centrally located about a longitudinal axis 26. The imaging prism, the at least one diffused light source, and the image sensor are mounted on a second PC board 22. The image sensor interfaces with the second PC board to pass fingerprint image information. The at least one light source also interfaces with the second PC board to receive power and/or activation information. A connector 24 is mounted on the second PC board, and additionally interfaces with the second PC board. The connector is used to transmit fingerprint image information, and to receive power and/or activation information, to and from an external source. The second PC board 22 and the PC board 46 communicate via the flexible cable 34. The PC board 46 communicates with a portable computer via connector 47.

In one embodiment, where the expansion card is a PCM-CIA expansion card, the width a of the imaging prism is approximately 16 mm, and the length c of the imaging prism is approximately 17 mm. The width e of the focal lens is approximately 3 mm. The width f of the redirectional prism is approximately 6 mm. The width g of the image sensor is approximately 10 mm, and may include any housing that the image sensor is encased within. The second PC board has width b, approximately 24 mm, and length d, approximately 32 mm. The connector 47 is a 68-pin PCMCIA connector.

An advantage of the invention is that the fingerprint recognition device is small enough to fit within a PCMCIA standard expansion card. Another advantage of the invention is that the fingerprint recognition system, when not in use, is enclosed within a portable computer's housing such that the invention does not use additional desk space in addition to the portable computer itself, other than that necessary for the retractable access portion to extend into an extended position.

Having disclosed exemplary embodiments and the best mode, modifications and variations may be made to the disclosed embodiments while remaining within the scope of the present invention as defined by the following claims.

What is claimed is:

1. An expansion card for a portable computer with an integrated fingerprint acquisition system comprising:
    a housing comprising an upper substantially planar surface and a lower substantially planar surface, said upper surface substantially parallel to said lower surface;
    a fingerprint acquisition device inside the housing;
    a retractable access portion capable of being retracted into and extended out from the housing, said retractable access portion includes at least a fingerprint receiving portion of the fingerprint acquisition device, such that when said retractable access portion is extended it is capable of receiving a fingerprint, and when said retractable access portion is retracted it is at least substantially flush with the ends of the upper and lower planar surfaces;
    a connector adapted to interface with a portable computer; and
    a locking mechanism such that when the retractable access portion is retracted, the locking mechanism prevents the retractable access portion from extending into the extended position wherein the locking mechanism comprises a spring, wire and groove, such that when the retractable access portion is retracted, pressure upon the slidable carriage will release said retractable access portion to an extended position.

2. The expansion card of claim 1, wherein the fingerprint acquisition device comprises:
    an imaging prism adapted to receive light from a light source, said imaging prism having an upper surface adapted to receive a fingerprint, and an adjacent surface configured to reflect a fingerprint image at a predetermined angle;
    a focal lens to focus the fingerprint image into a focused image, said focal lens adapted to receive the fingerprint image from said imaging prism;
    a redirectional prism having substantially parallel upper and lower surfaces, and an adjacent surface configured at a second predetermined angle to reflect the focused image towards the upper surface, said upper surface reflects the focused image towards the lower surface; and
    an image sensor beneath the redirectional prism.

3. The expansion card of claim 2, wherein the light source is a diffused light source.

4. The expansion card of claim 1, wherein the card and connector conform to the physical standards for PCMCIA expansion cards.

5. The expansion card of claim 2, wherein the card and connector conform to the size standards for PCMCIA expansion cards.

6. The expansion card of clam 3, wherein the card and connector conform to the size standards for PCMCIA expansion cards.

7. The expansion card of claim 1, further comprising a cleaner configured to clean a prism surface when said retractable access portion is retracted.

8. The expansion card of claim 7, wherein the card and connector conform to the size standards for PCMCIA expansion cards.

* * * * *